(12) United States Patent
Xie et al.

(10) Patent No.: US 10,347,669 B2
(45) Date of Patent: Jul. 9, 2019

(54) METHOD FOR MANUFACTURING A FLEXIBLE DISPLAY DEVICE

(71) Applicant: BOE TECHNOLOGY GROUP CO., LTD., Beijing (CN)

(72) Inventors: Chunyan Xie, Beijing (CN); Mingche Hsieh, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 63 days.

(21) Appl. No.: 15/322,142

(22) PCT Filed: Mar. 29, 2016

(86) PCT No.: PCT/CN2016/077611
§ 371 (c)(1),
(2) Date: Dec. 26, 2016

(87) PCT Pub. No.: WO2016/169397
PCT Pub. Date: Oct. 27, 2016

(65) Prior Publication Data
US 2017/0133411 A1 May 11, 2017

(30) Foreign Application Priority Data

Apr. 23, 2015 (CN) .......................... 2015 1 0196706

(51) Int. Cl.
| | | |
|---|---|---|
| *H01L 21/78* | (2006.01) | |
| *H01L 23/58* | (2006.01) | |
| *H01L 27/12* | (2006.01) | |
| *H01L 21/683* | (2006.01) | |
| *H01L 23/544* | (2006.01) | |

(52) U.S. Cl.
CPC ...... *H01L 27/1262* (2013.01); *H01L 21/6836* (2013.01); *H01L 21/78* (2013.01);
(Continued)

(58) Field of Classification Search
CPC ... H01L 21/6836; H01L 21/78; H01L 23/585; H01L 23/544; H01L 2221/68327; H01L 27/1262; H01L 27/1218
See application file for complete search history.

(56) References Cited

U.S. PATENT DOCUMENTS

2012/0235315 A1* 9/2012 Wu ..................... H01L 21/6835
264/104
2013/0071650 A1* 3/2013 Liu ......................... B32B 37/26
428/333
(Continued)

FOREIGN PATENT DOCUMENTS

CN   103035490 A   4/2013
CN   103236418 A   8/2013
(Continued)

OTHER PUBLICATIONS

Chinese First Office Action for Chinese Application No. 201510196706.4 dated Dec. 3, 2015, 6 Pages.
(Continued)

*Primary Examiner* — Mohsen Ahmadi
*Assistant Examiner* — Scott E Bauman
(74) *Attorney, Agent, or Firm* — Brooks Kushman P.C.

(57) ABSTRACT

A flexible display device and a method for manufacturing the same are provided. The method includes providing a rigid sheet having cutting streets, forming a protective pattern on the rigid sheet, the protective pattern covering the cutting streets, and forming a flexible substrate including a reserved region and an unreserved region on the rigid sheet provided with the protective pattern, where the flexible substrate covers the protective pattern, and boundaries between the reserved region and the unreserved region are within regions occupied by the cutting streets. The method further includes fabricating a display component on the flexible substrate in the reserved region, and cutting the (Continued)

flexible substrate along the cutting streets, removing the unreserved region of the flexible substrate and reserving the reserved region of the flexible substrate, incisions caused by cutting being within a region of the protective pattern, and separating the cut flexible substrate from the rigid sheet.

7 Claims, 3 Drawing Sheets

(52) U.S. Cl.
CPC .......... *H01L 23/544* (2013.01); *H01L 23/585* (2013.01); *H01L 27/1218* (2013.01); *H01L 2221/68327* (2013.01)

(56) References Cited

U.S. PATENT DOCUMENTS

2014/0065916 A1* 3/2014 Lee .................. H01L 51/003
445/25

2014/0327006 A1* 11/2014 Ke .................. H01L 33/02
257/49
2016/0284781 A1* 9/2016 Jiang .................. H01L 27/3276

FOREIGN PATENT DOCUMENTS

| CN | 103325337 A | 9/2013 |
| CN | 103337480 A | 10/2013 |
| CN | 104821294 A | 8/2015 |

OTHER PUBLICATIONS

Chinese Third Office Action for Chinese Application No. 201510196706.4, dated Aug. 2, 2016, 3 Pages.

International Search Report and Written Opinion for Application No. PCT/CN2016/077611, dated Mar. 29, 2016, 12 Pages.

\* cited by examiner

METHOD FOR MANUFACTURING A FLEXIBLE DISPLAY DEVICE

CROSS-REFERENCE TO RELATED APPLICATIONS

This application is the U.S. national phase of PCT Application No. PCT/CN2016/077611 filed on Mar. 29, 2016, which claims priority to Chinese Patent Application No. 201510196706.4 filed on Apr. 23, 2015, the disclosures of which are incorporated in their entirety by reference herein.

TECHNICAL FIELD

The present disclosure relates to the field of display manufacturing technology, in particular to a flexible display device and a method for manufacturing the same.

BACKGROUND

In a method for manufacturing a flexible display device of a relevant technology, usually, a flexible material is coated on a glass sheet to form a flexible substrate, and then thin film transistors (TFTs) as well as light-emitting elements are fabricated on the flexible substrate. After the manufacture for the display device is finished, flexible components (the flexible substrate, TFTs and the light-emitting elements) are usually separated from the glass sheet using a laser beam. However, the flexible material may not be uniformly coated at a coating beginning region and a coating ending region with respect to other regions, i.e., property of the flexible substrate at a periphery region may be different from that at a central region. Therefore, it is difficult to separate the whole glass sheet from the flexible components using the laser beam, and the flexible components may be damaged during the laser separation process. In view of the above, one solution is to cut off the non-uniform periphery region of the flexible substrate using laser beam before the laser separation process. When cutting the flexible substrate, the glass sheet under the flexible substrate cannot be damaged. Once the glass substrate is damaged, there is a risk of chip breakage in following processes, which affects the overall process yield.

SUMMARY

The present disclosure provides a flexible display device and a method for manufacturing the same, which can prevent a sheet from being damaged when cutting an element on the sheet.

According to some embodiments of the present disclosure, a method for manufacturing a flexible display device is provided, where the method includes:

providing a rigid sheet, where the rigid sheet is provided with cutting streets;

forming a protective pattern on the rigid sheet, where the protective pattern covers the cutting streets;

forming a flexible substrate including a reserved region and an unreserved region on the rigid sheet provided with the protective pattern, where the flexible substrate covers the protective pattern, and boundaries between the reserved region and the unreserved region are within regions occupied by the cutting streets;

fabricating a display component of the flexible display device on the flexible substrate in the reserved region;

cutting the flexible substrate along the cutting streets, removing the unreserved region of the flexible substrate and reserving the reserved region of the flexible substrate, where incisions caused by cutting are within a region where the protective pattern is located; and separating the flexible substrate after cutting from the rigid sheet.

Optionally, the flexible substrate is cut along the cutting streets using a laser beam, and the protective pattern is made of a material having a laser absorption rate greater than a first threshold and/or a laser reflectivity greater than a second threshold.

Optionally, the protective pattern comprises two layers, one layer has a laser absorption rate greater than the first threshold, and the other layer has a laser reflectivity greater than the second threshold.

Optionally, the protective pattern is made of a metal material.

Optionally, the metal material includes one or any combination of: aluminum, silver and molybdenum.

Optionally, the protective pattern has a thickness ranging from 1000 to 2000 angstroms.

Optionally, the rigid sheet is a glass sheet.

Optionally, the cutting streets are preprinted on the rigid sheet.

In addition, the present disclosure provides a flexible display device that is manufactured by the aforementioned manufacturing method.

In the technical solution of the present disclosure, the protective pattern is provided on the cutting streets of the rigid sheet. With the arrangement of the protective pattern, the rigid sheet is prevented from being damaged when cutting the flexible substrate on the rigid sheet, thereby avoiding adverse impacts caused by breakage of the rigid sheet on following process for manufacturing the flexible display device, so as to improve the process yield.

DETAILED DESCRIPTION

In order to make a technical solution and advantageous clearer, detailed description of the present disclosure is set forth hereinafter with reference to the drawings and embodiments.

Figure 1:
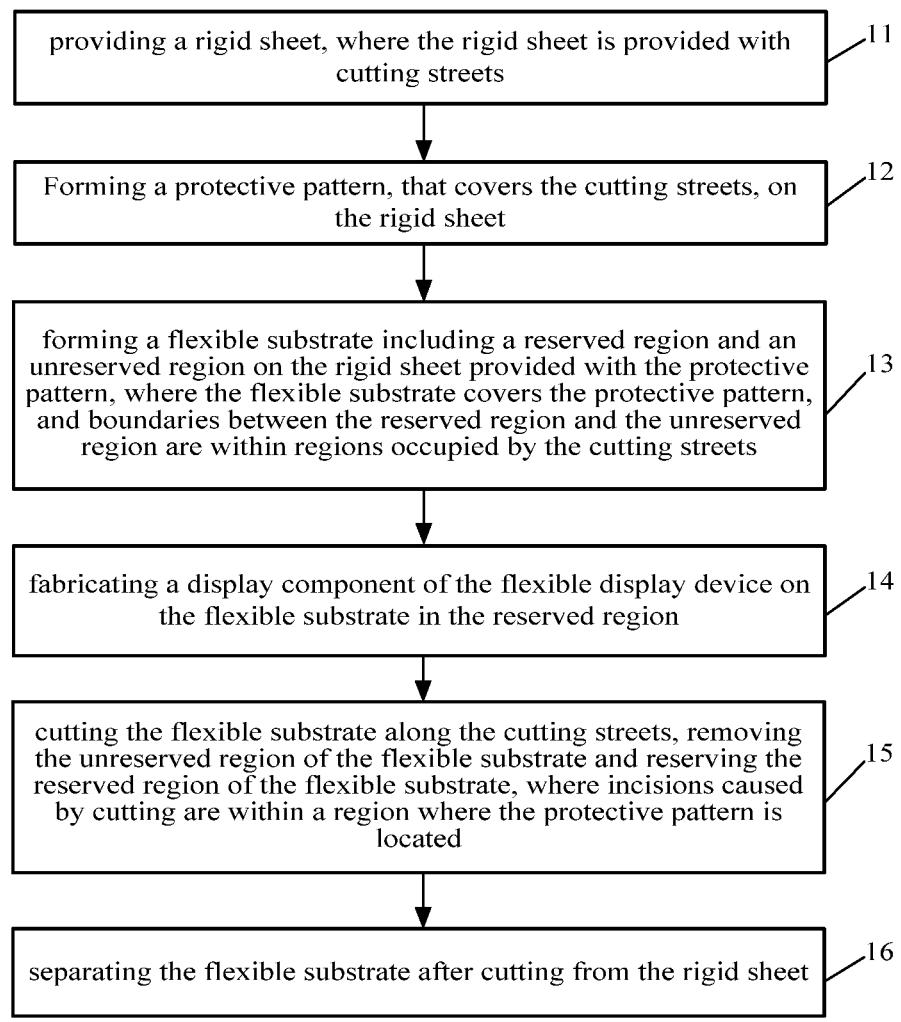
FIG. 1 is a schematic flow chart of a method for manufacturing a flexible display device provided in the present disclosure.

According to some embodiments of the present disclosure, a method for manufacturing a flexible display device is provided. As shown in FIG. 1, the method includes following steps 11 to 16.

In step 11, a rigid sheet is provided. Optionally, the rigid sheet is a glass sheet.

In step 12, a protective pattern is formed on the rigid sheet. In this step, a layer of material for the protective pattern may be deposited on the rigid sheet provided with cutting streets, and the layer of material is patterned to form the protective pattern that corresponds to and covers regions occupied by the cutting streets. Alternatively, a protective pattern having a shape consistent with an overall shape of the cutting streets is printed on the rigid sheet. Optionally, the cutting streets are preprinted on the rigid sheet.

In step 13, a flexible substrate including a reserved region and an unreserved region is formed on the rigid sheet provided with the protective pattern. The flexible substrate covers the protective pattern.

In step 14, a display component of the flexible display device is fabricated on the flexible substrate in the reserved region.

In step 15, the flexible substrate is cut along the cutting streets, the unreserved region of the flexible substrate is removed and the reserved region of the flexible substrate is reserved. Incisions caused in the cutting process are within a region where the protective pattern is located.

In step 16, the flexible substrate after cutting is separated from the rigid sheet.

In the manufacturing method according to the embodiments of the present disclosure, the protective pattern is provided on the cutting streets of the rigid sheet. With the arrangement of the protective pattern, the rigid sheet is prevented from being damaged when cutting the flexible substrate on the rigid sheet along the cutting streets, thereby avoiding adverse impacts caused by breakage of the rigid sheet on following process for manufacturing the flexible display device, so as to improve the process yield.

Specifically, in the step 15, the flexible substrate may be cut using a laser beam. Correspondingly, the protective pattern can absorb the laser energy and/or reflect the laser. The protective pattern is made of a material having a laser absorption rate greater than a first threshold and/or having a laser reflectivity greater than a second threshold. The first threshold and the second threshold herein are set according to actual laser cutting energy.

Optionally, in some embodiments of the present disclosure, to better filter out the laser energy, the protective pattern may include two layers, one layer is made of a material that can absorb the laser energy, and the other layer is made of a material that can reflect the laser. In some embodiments of the present disclosure, the protective pattern may be made of a composite of a material that can absorb the laser energy and a material that can reflect the laser. The material that can absorb the laser energy has a laser absorption rate greater than the first threshold, and the material that can reflect the laser has a laser reflectivity greater than the second threshold.

In practice, the protective pattern may be made of a common metal material such as aluminum (Al), silver (Ag), molybdenum (Mo). Preferably, the protective pattern may have a thickness ranging from 1000 to 2000 angstroms. The reflectivity of a silver protective pattern with a thickness greater than 1000 angstroms is almost 100%. The reflectivity of an aluminum protective pattern with a thickness greater than 1000 angstroms and the reflectivity of a molybdenum protective pattern with a thickness greater than 1000 angstroms are equal to or more than 90%. The protective pattern made of a metal material such as Ag, Al, Mo can reflect most of the laser energy, and consequently can withstand the laser cutting and protect the rigid sheet.

The procedure of the manufacturing method according to the embodiments of the present disclosure is described in detail below.

The procedure of the manufacturing method according to the embodiments includes steps 21 to 25.

Figure 2A:
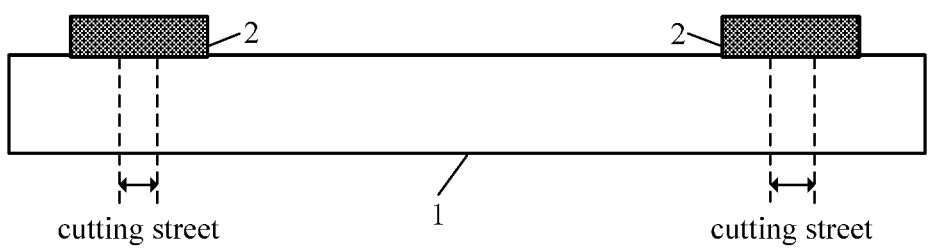
FIGS. 2A-2E schematically show a detailed procedure of a method for manufacturing a flexible display device provided in the present disclosure.

In step 21, as shown in FIG. 2A, a protective pattern 2 is formed on a glass sheet 1 and covers regions occupied by cutting streets of the glass sheet 1. Specifically, the cutting streets may be preprinted on one side of the glass sheet 1. The regions occupied by the cutting streets are indicated in FIG. 2A by dotted lines within the glass sheet 1. It should be noted that in the drawings, the regions occupied by the cutting streets are shown by the dotted lines within the rigid sheet 1 for ease of understanding, and the cutting streets are actually provided on the surface of one side of the glass sheet 1.

Figure 2B:
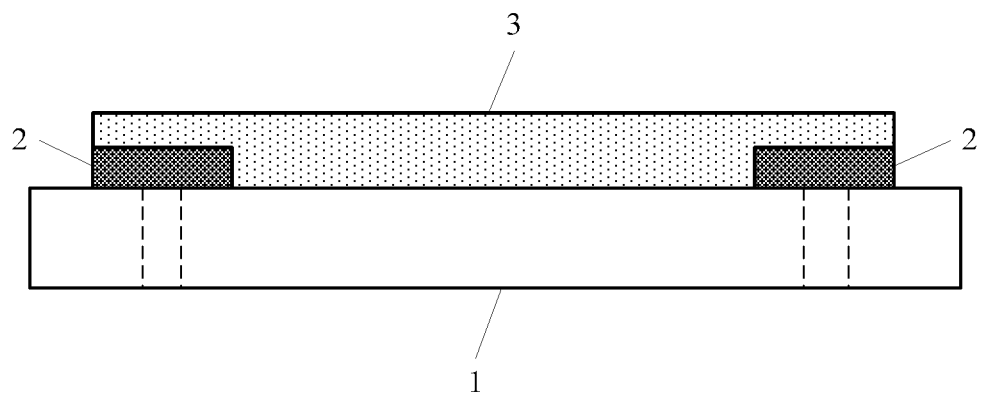

In step 22, as shown in FIG. 2B, a flexible substrate 3 is formed on the glass sheet 1 provided with the protective pattern 2, where the flexible substrate 3 covers the protective pattern 2.

Figure 2C:
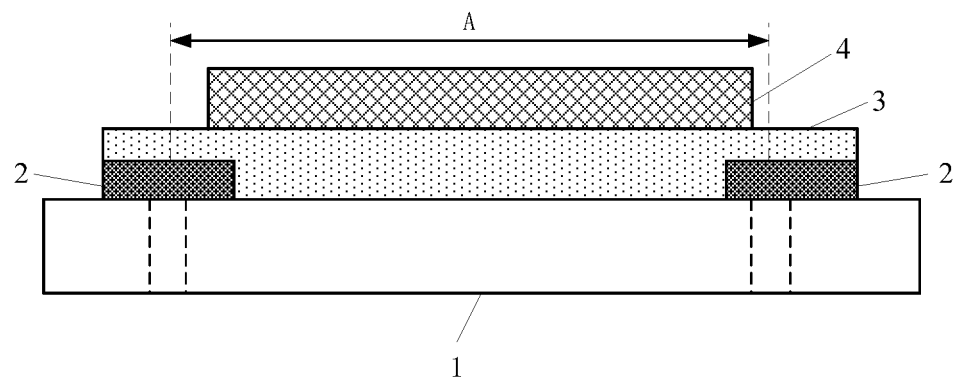

In step 23, as shown in FIG. 2C, a display component is fabricated on the flexible substrate 3. The flexible substrate 3 includes a reserved region A and an unreserved region. The unreserved region is a part of the flexible substrate 3 in addition to the reserved region A. The display component is formed in the reserved region A. Boundaries between the reserved region A and the unreserved region are within the regions occupied by the cutting streets.

Figure 2D:
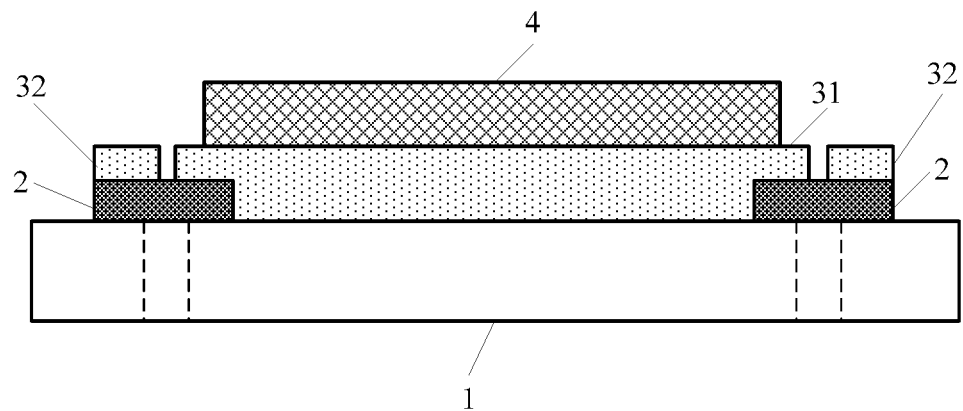

In step 24, as shown in FIG. 2D, peripheries of the flexible substrate 3 are cut, unreserved parts 32 of the flexible substrate 3 are removed, and a reserved part 31 of the flexible substrate 3 is reserved.

Figure 2E:
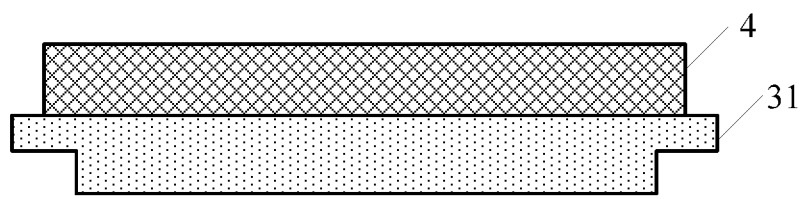

In step 25, as shown in FIG. 2E, the flexible substrate after cutting is separated from the glass sheet to obtain the flexible display device including the reserved part 31 of the flexible substrate 3 and the fabricated display component 4. It should be noted that, a final shape of the flexible display device is not limited to that shown in FIG. 2E.

In conclusion, by adopting the manufacturing method according to the embodiments, the rigid sheet can be prevented from being damaged when cutting the flexible substrate, which can extend service life of the rigid sheet to some extent, improve the yield of the flexible display device and reduce manufacturing cost.

In addition, a flexible display device manufactured by adopting the aforementioned manufacturing method is also provided according to some embodiments of the present disclosure. The flexible display device may be a bendable device such as a flexible display screen.

The above are merely preferred embodiments of the present disclosure. It should be noted that, a person skilled in the art may make improvements and modifications without departing from the principle of the present disclosure, and these improvements and modifications shall also fall within the scope of the present disclosure.

What is claimed is:

1. A method for manufacturing a flexible display device, comprising steps of:
providing a rigid sheet, wherein the rigid sheet is provided with cutting streets;
forming a protective pattern on the rigid sheet, wherein the protective pattern covers the cutting streets and includes an opening in a region between the cutting streets;
forming a flexible substrate comprising a reserved region and an unreserved region on the rigid sheet provided with the protective pattern, wherein the flexible substrate covers the protective pattern, the flexible substrate contacts with the rigid sheet through the opening, and boundaries between the reserved region and the unreserved region are within regions occupied by the cutting streets;
fabricating a display component of the flexible display device on the flexible substrate in the reserved region;
cutting the flexible substrate along the cutting streets, removing the unreserved region of the flexible substrate and reserving the reserved region of the flexible substrate, wherein incisions caused by cutting are within a region where the protective pattern is located; and separating the flexible substrate after cutting from the rigid sheets, wherein the protective pattern comprises two layers, one layer has a laser absorption rate greater than a first threshold, and the other layer has a laser reflectivity greater than a second threshold, the two layers are both made of a metal material.

2. The method according to claim 1, wherein the step of cutting the flexible substrate along the cutting streets comprises:

cutting the flexible substrate along the cutting streets using a laser beam.

3. The method according to claim 1, wherein the metal material comprises one or any combination of: aluminum, silver and molybdenum.

4. The method according to claim 3, wherein the protective pattern has a thickness ranging from 1000 to 2000 angstroms.

5. The method according to claim 1, wherein the rigid sheet is a glass sheet.

6. The method according to claim 1, wherein the cutting streets are preprinted on the rigid sheet.

7. A flexible display device, manufactured by the method according to claim 1.

* * * * *